United States Patent
Ohta et al.

[11] Patent Number: 5,216,254
[45] Date of Patent: Jun. 1, 1993

[54] CIRCUIT PATTERN FORMING APPARATUS USING MU-STM

[75] Inventors: Hiroko Ohta, Hachioji; Ryouhei Shimizu, Koshigaya; Toshihito Kouchi, Hachioji; Akitoshi Toda, Kunitachi; Yasuo Isono, Fussa; Yoshiyuki Mimura, Hachioji; Hiroshi Kajimura, Tokyo, all of Japan

[73] Assignee: Olympus Optical Co., Ltd., Tokyo, Japan

[21] Appl. No.: 517,588

[22] Filed: May 1, 1990

[30] Foreign Application Priority Data

May 9, 1989 [JP] Japan ................................. 1-115821

[51] Int. Cl.⁵ ............................................. G01N 23/00
[52] U.S. Cl. ................................ 250/492.2; 250/306; 250/492.3
[58] Field of Search ........... 250/492.1, 492.21, 492.23, 250/492.22, 492.3, 423 F, 306, 310, 311; 427/37, 38; 437/228

[56] References Cited

U.S. PATENT DOCUMENTS

| | | | |
|---|---|---|---|
| 4,477,729 | 10/1984 | Chang et al. | 250/492.2 |
| 4,668,865 | 5/1987 | Gimzewski et al. | 250/306 |
| 4,785,189 | 11/1988 | Wells | 250/492.2 |
| 4,831,614 | 5/1989 | Duerig et al. | 250/306 |
| 4,906,840 | 3/1990 | Zdeblick et al. | 250/306 |
| 4,912,822 | 4/1990 | Zdeblick et al. | 250/306 |
| 4,968,390 | 11/1990 | Bard et al. | 204/15 |
| 4,998,016 | 3/1991 | Nose et al. | 250/306 |
| 5,015,850 | 5/1991 | Zdeblick et al. | 250/306 |
| 5,043,577 | 8/1991 | Pohl et al. | 250/306 |

FOREIGN PATENT DOCUMENTS

| | | |
|---|---|---|
| 0105214 | 4/1984 | European Pat. Off. |
| 0194323 | 9/1986 | European Pat. Off. |
| 0200083 | 12/1986 | European Pat. Off. |
| WO89/07256 | 8/1989 | World Int. Prop. O. |

OTHER PUBLICATIONS

Chang et al., "Nanostructure Technology" IBM J. Res. Develop vol. 32 No. 4 Jul. 1988.
Applied Physics Letter, vol. 51, No. 4, Jul. 27, 1987, pp. 247-249, article entitled "Direct Writing of Submicron Metallic Features with a Scanning Tunneling Microscope" by R. M. Silver, et al.

*Primary Examiner*—Jack I. Berman
*Assistant Examiner*—James Beyer
*Attorney, Agent, or Firm*—Frishauf, Holtz, Goodman & Woodward

[57] ABSTRACT

An apparatus for forming a predetermined circuit pattern on a circuit substrate by using a $\mu$-STM write head, the $\mu$-STM write head comprising a write head substrate having a flat surface, a plurality of micro chip electrodes formed upright on the flat surface of the write head substrate and constituting a $\mu$-STM, a level of a distal end of each of the chip electrodes being set to be constant, and scanning means for scanning the micro chip electrodes on the circuit substrate by moving the micro chip electrodes and the circuit substrate relative to each other in two-dimensional directions.

4 Claims, 10 Drawing Sheets

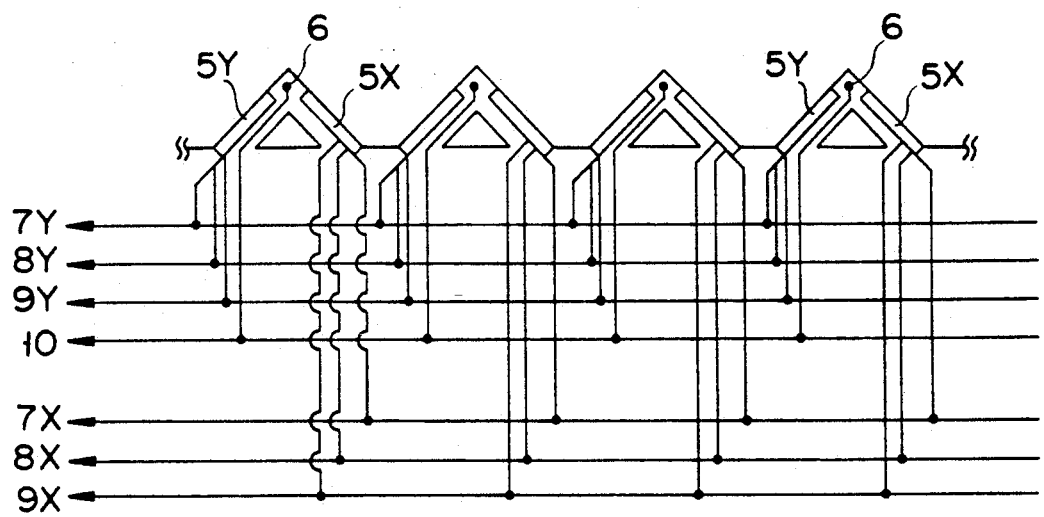
F I G. 5
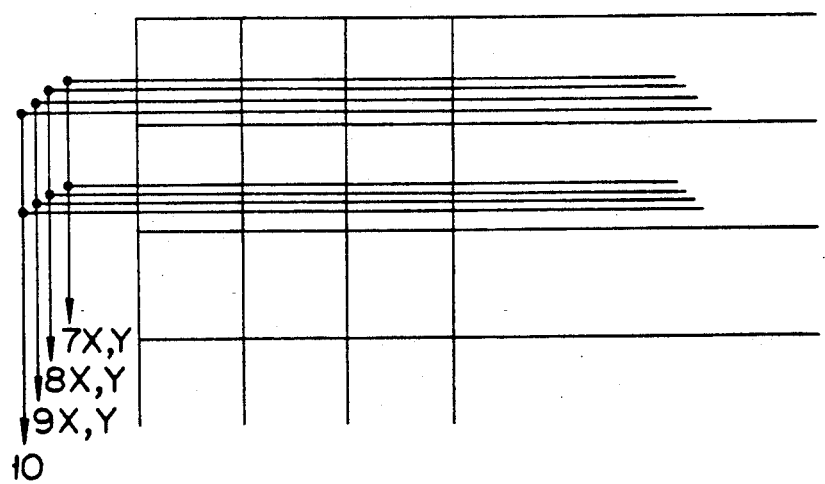
F I G. 6

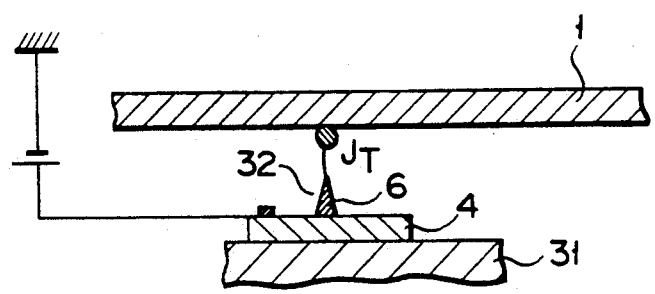
FIG. 7
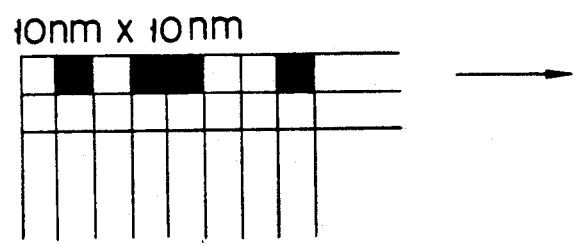
FIG. 8A
FIG. 8B
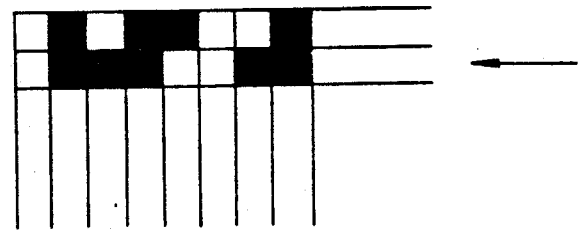
FIG. 9A
FIG. 9B

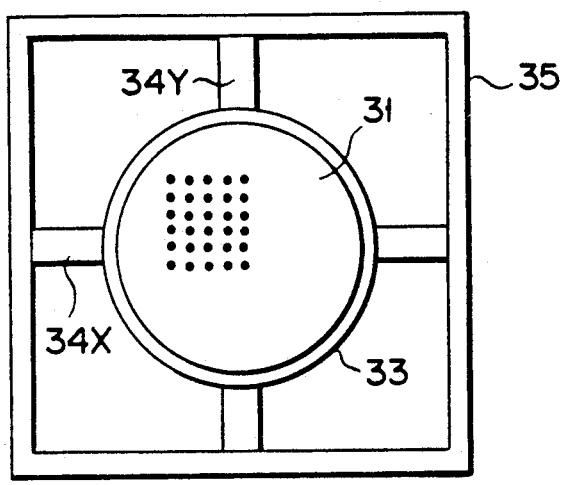
F I G. 13A
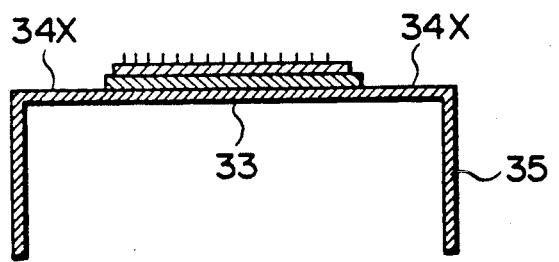
F I G. 13B

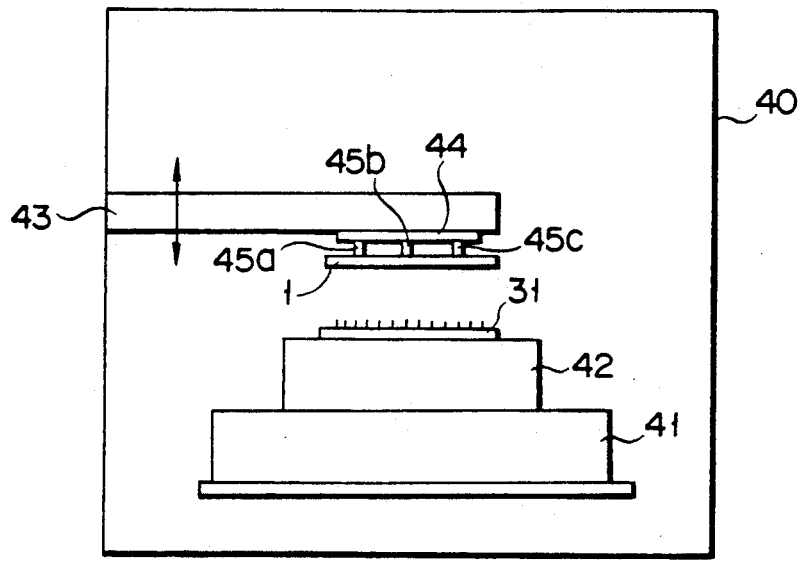
F I G. 14
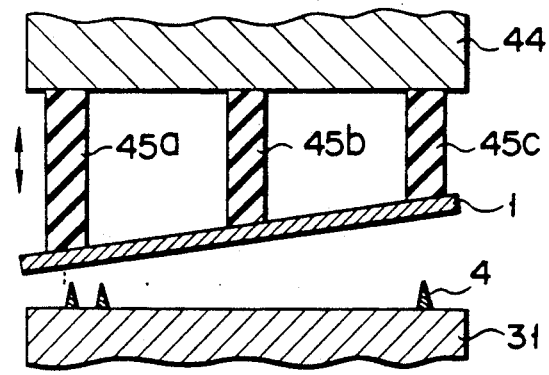
F I G. 15A
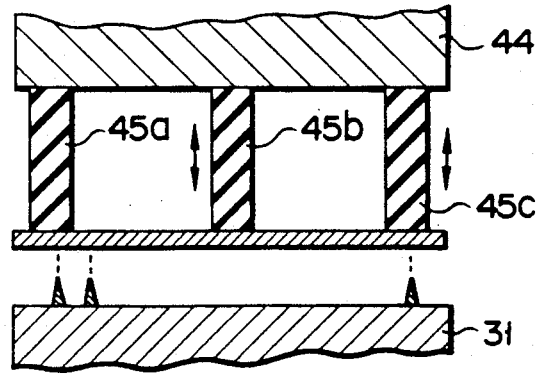
F I G. 15B

CIRCUIT PATTERN FORMING APPARATUS USING MU-STM

BACKGROUND OF THE INVENTION

1. Field of the Invention

The present invention relates to an apparatus for forming a circuit pattern and, more particularly, to a pattern forming apparatus using a μ-STM and a method of forming a circuit pattern using the same.

2. Description of the Related Art

In the manufacture of large scale integrated circuits (LSI circuits) and the like, the step of forming various types of thin-film patterns such as a metal thin-film pattern as a wiring pattern is very important. Photolithography has been widely used for the formation of these patterns. In photolithography, a photosensitive resin film is exposed with ultraviolet rays, X-rays, an electron beam, or the like, and is developed to form a resin pattern having a predetermined plane shape. A semiconductor layer or a metal thin film on which the resin pattern has been formed is then selectively etched by using this resin pattern as a mask so as to be processed into a desired pattern. That is, a pattern forming method by photolithography is an indirect method via the resin pattern formation.

On the other hand, a pattern forming method employing the following direct writing method is also known. In this method, an electron beam or an ion beam is radiated onto a substrate in an atmosphere of, e.g., a gaseous organometallic compound. With this operation, the organometallic compound is decomposed, and free metal particles are deposited on the irradiated portion of the substrate. Therefore, by scanning an electron beam or an ion beam, a metal thin-film pattern is formed on the substrate.

Currently, a pattern having a line width of 100 nm can be formed by these techniques. However, in order to increase the integration density of an LSI circuit, elements must be further miniaturized. In order to miniaturize elements, a patterning technique with a higher resolution is indispensable. Under the circumstances, studies for achieving higher fineness and precision have been made. For example, a direct writing method and lithography based on the principle of a scanning tunneling microscope (to be referred to as an STM hereinafter) have been proposed.

An STM and a pattern forming method based thereon will be described below.

An STM is designed to scanning-microscopically observe the arrangement of atoms on a surface of a solid substance by using a free electron wave (tunnel current) penetrating through the surface due to a tunnel effect. Of controllable waves, a free electron wave has the shortest wavelength, which is equal to about the interatomic distance in a solid substance. Therefore, by applying the principle of an STM to lithography or the like, a finer pattern than that obtained by a conventional method can be formed.

FIGS. 1A and 1B show a direct writing method based on the principle of an STM. Referring to FIG. 1A, reference numeral 1 denotes a substrate having a surface on which a pattern is to be formed; and 2, a needle-like chip electrode for flowing a tunnel current. The substrate 1 is placed in a gas atmosphere of an organometallic compound, and the chip electrode 2 is arranged near the surface of the substrate 1. When a tunnel current $J_T$ is caused to flow between the chip electrode 2 and the substrate 1, the organometallic compound adsorbed on the substrate surface is dissociated by the energy of the current, and the free metal is deposited as metal particles 3 on the surface of the substrate 1. Therefore, by scanning the chip electrode 2 in the direction indicated by an arrow as shown in FIG. 1B, a metal thin-film pattern can be formed on the surface of the substrate 1.

In addition to the direct writing method shown in FIGS. 1A and 1B, lithography using a tunnel current can be performed in a similar manner. In this case, a lift-off technique is normally used instead of selective etching.

In the pattern forming method using the chip electrode 2, the highest resolution can be obtained by using a tunnel current, as described above. However, this method may be performed by using a current in a field emission region which has a higher energy than a tunnel current. Especially, in pattern formation by lithography, a current in a field emission region is preferably used. In a direct writing method using a current in a field emission region, it is considered that a local plasma formed by field emission contributes to the deposition of metal particles.

In order to form a micropattern such as an LSI wiring pattern by a method using the above-described STM, the chip electrode 2 is required to be greatly reduced in size and to be scanned within a predetermined micro-area. For this reason, by applying an LSI process, a micro chip electrode is formed on a distal end of a cantilever which has 5 μm of thickness and is formed within a region of 1 mm × 5 μm. In the following description, the device including such micro chip electrode designed to be scanned will be called a "μ-STM", regardless of whether a tunnel current or a current in a field emission region is used.

A known μ-STM is provided with an actuator having four bimorph structures arranged along the longitudinal direction of the actuator, each of the bimorph structures being used for scanning the chip electrode in the upward, downward, leftward or rightward direction.

Another known μ-STM of cantilever type is shown in FIGS. 2A, 2B, and 2C (disclosed in Third STM International Meeting).

Referring to FIG. 2A, reference numeral 4 denotes a substrate. A semiconductor substrate such as a silicon substrate is used as the substrate 4. X-direction actuators 5X and 5Y are arranged on the upper surface of the substrate 4. Both the actuators 5X and 5Y extend outward from a peripheral portion of the substrate 4. The distal ends of the actuators 5X and 5Y are integrated with each other, thereby forming a chip corner. A micro chip electrode 6 is formed upright on the surface of the chip corner. In addition, various wires 7X to 9X, 7Y to 9Y, and 10 are formed on the surface of the substrate 4.

FIG. 2B is a cross-sectional view of the actuators 5X and 5Y. As shown in FIG. 2B, each actuator is a multi-layered member consisting of an $SiO_2$ layer 11, an Al layer 12, a piezoelectric layer 13, an Al layer 14, a piezoelectric layer 15, and an Al+Au layer 16. As a piezoelectric substance, ZnO, lead zirconium titanate ($Pb(ZrTi)O_3$), or the like is used. The Al layers 12 and 14 and the Au layer 16 constitute voltage applying electrodes. Voltages are applied to the piezoelectric layers 13 and 15 through these electrodes. Upon this voltage application, the piezoelectric layers 13 and 15 cause expansion and contraction deformation at a rate of about 240 Å /v. Therefore, the deformations of the actuators 5X and 5Y are adjusted by controlling voltages to be applied, thus scanning the micro chip electrode 6 within a predetermined small range, not only in X-direction but also in Y- or Z-direction.

FIG. 2C is a plan view showing a wiring of the cantilever type μ-STM. As shown in FIG. 2C, various wires are formed on the surface of the substrate 4. The wires 7X, 8X, and 9X are respectively connected to the electrodes 16, 14, and 12 of the actuator 5X. The wires 7Y, 8Y, and 9Y are respectively connected to the electrodes 16, 14, and 12 of the actuator 5Y. The wire 10 is connected to the micro chip electrode 6. In addition, terminals 17X to 19X, 17Y to 19Y, and 20 are respectively formed on the proximal ends of the wires.

The above-described cantilever type μ-STM is manufactured on the basis of an LSI process. More specifically, the actuators 5X and 5Y as multilayered members each consisting of the $SiO_2$ layer 11, the Al layer 12, the piezoelectric layer 13, the Al layer 14, the piezoelectric layer 15, and the Al+Au layer 16 are formed on a substrate 4 by using a technique such as CVD, sputtering, or PEP (photo-engraving process). In addition, the micro chip electrode 6 is formed. Thereafter, a portion of the substrate 4 is removed by etching so as to cause the actuators 5X and 5Y to protrude from the peripheral portion of the substrate 4, as shown in FIGS. 2A and 2C.

The micro chip electrode 6 is formed in the manner shown in FIGS. 3A, 3B, and 3C. More specifically, a spacer layer 21 consisting of a removable substance such as Cu, and a mask layer 22 consisting of Ti/W are formed on the piezoelectric layer 15 constituting each actuator. By performing PEP, an opening having a diameter of about 5μ is formed in the mask layer 22. The spacer layer 21 is then overetched by using the mask layer 22 as an etching mask, thus forming an undercut hole 23. As shown in FIG. 3B, the conical chip electrode 6 is formed in the undercut hole 23 by vacuum deposition of a metal such as Ta. Subsequently, the spacer layer 21 is etched to lift off the mask layer 22 and the Ta layer deposited thereon, as shown in FIG. 3C.

Currently, a pattern can be formed to have a line width on the order of 10 nm by employing the method using the μ-STM. However, for example, the following problems are posed when this method is applied to an LSI manufacturing process.

In the manufacture of LSI circuits, predetermined LSI circuits are respectively formed in a large number of LSI-chip regions on one wafer. If these LSI circuits are to be manufactured by a μ-STM having only one micro chip electrode, wiring patterns and the like must be sequentially formed on the large number of LSI-chip regions. Therefore, a very long period of time is required, and practical productivity cannot be obtained.

SUMMARY OF THE INVENTION

It is the first object of the present invention to provide a circuit pattern forming apparatus using a μ-STM which can simultaneously form wiring patterns and the like in a large number of LSI-chip regions on a semiconductor wafer.

It is the second object of the present invention to provide a circuit pattern forming method using the apparatus.

In order to achieve the first object, according to the present invention, there is provided an apparatus for forming a predetermined circuit pattern on a circuit substrate by using a μ-STM write head, the μ-STM write head comprising:

a write head substrate having a flat surface;

a plurality of micro chip electrodes formed upright on the fat surface of the write head substrate and constituting a μ-STM, a level of a distal end of each of the chip electrodes being set to be constant; and scanning means for scanning the micro chip electrodes on the circuit substrate by moving the micro chip electrodes and the circuit substrate relative to each other in two-dimensional directions.

In order to achieve the second object, according to the present invention, there is provided a method of forming a plurality of circuit patterns on a circuit substrate by direct writing, comprising the steps of:

positioning a write head according to the present invention and the circuit substrate to be close to each other; and applying a bias voltage to micro chip electrodes of the write head in an atmosphere of a gaseous organometallic compound while moving the micro chip electrodes and the circuit substrate relative to each other in two-dimensional directions so as to dissociate the organometallic compound and liberate metal particles, and depositing the metal particles on the circuit substrate.

The second object can be achieved by a method of forming a plurality of circuit patterns on a circuit substrate by lithography, comprising the steps of:

positioning a write head according to the present invention and the circuit substrate having a resist film formed on a surface thereof to be close to each other:

writing a pattern on the resist film by applying a bias voltage to micro chip electrodes of the write head while moving the micro chip electrodes and the circuit substrate relative to each other in two-dimensional directions;

forming a desired mask pattern on the circuit substrate by developing the resist film on which the pattern is written;

depositing a desired circuit material film by CVD, on the circuit substrate having the mask pattern; and removing the mask pattern and the circuit material film deposited thereon so as to leave the circuit material film on portions of the surface of the circuit substrate which are not covered with the mask pattern.

In addition, the second object can be achieved by a selective etching method using a mask pattern formed in the above-described manner.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 4A to 6 are views showing a circuit pattern forming apparatus according to an embodiment of the present invention;

FIGS. 7 to 11B are views showing a circuit pattern forming method using the apparatus in FIGS. 4A to 6;

FIGS. 12A to 13B are views showing a circuit pattern forming apparatus according to another embodiment of the present invention; and FIGS. 14 to 15B are views for explaining an apparatus used for the execution of the circuit pattern forming method of the present invention.

DETAILED DESCRIPTION OF THE PREFERRED EMBODIMENTS

The present invention will be described in more detail below with reference to the preferred embodiments illustrated in the accompanying drawings.

Figure 4A:
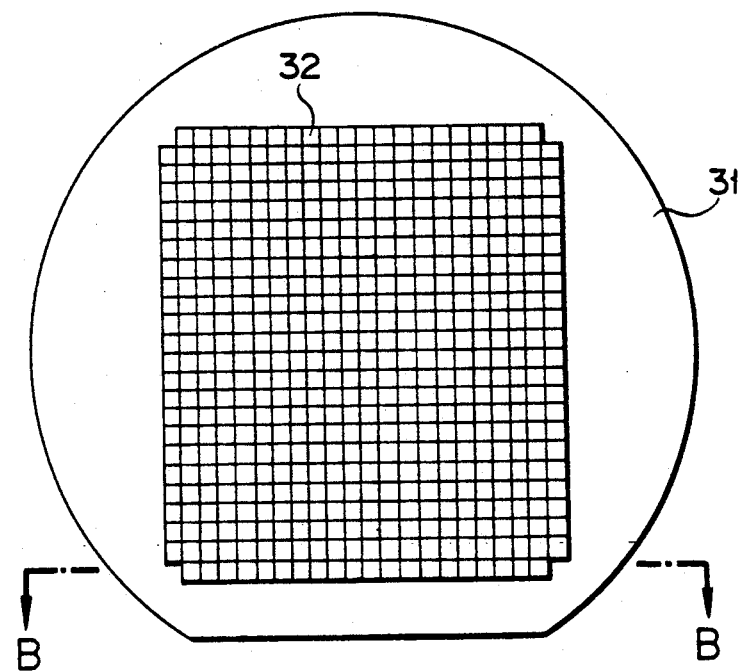
Figure 4B:
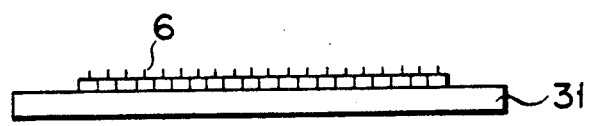
Figure 4C:
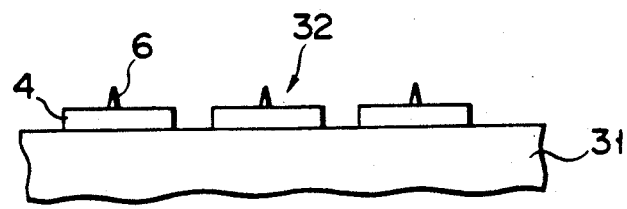

FIGS. 4A to 4C show a circuit pattern forming apparatus according to an embodiment of the present invention. FIG. 4A is a plan view of a write head. FIG. 4B is a sectional view taken along a line B—B in FIG. 4A. FIG. 4C is an enlarged sectional view showing part of the write head.

Figure 2A:
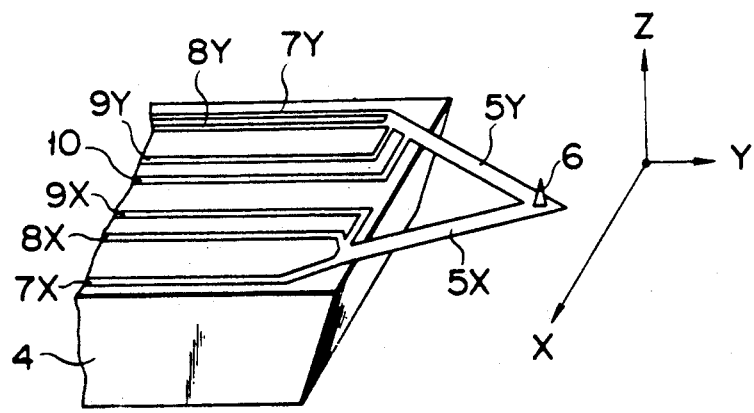
FIGS. 2A to 2C are views showing a conventional μ-STM employed in the present invention.
Figure 2B:
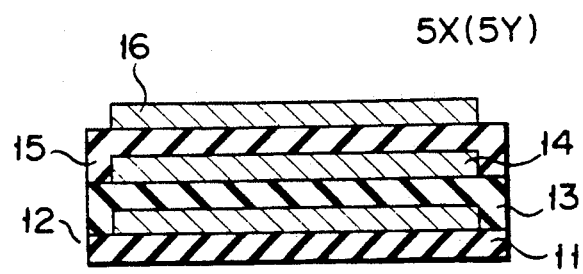
Figure 2C:
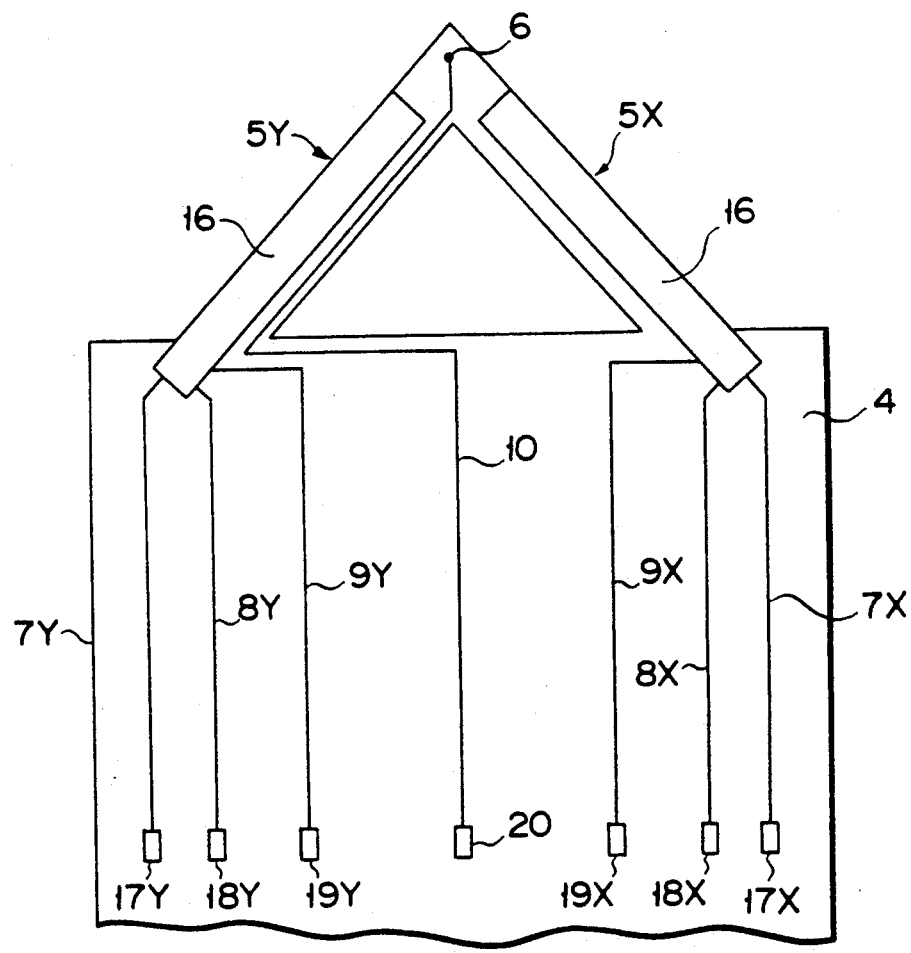

Referring to FIGS. 4A to 4C, reference numeral 31 denotes a silicon wafer having a diameter of 4 inches which is used as a substrate of the write head. 500 μ-STMs 32 are formed on the wafer 31 in a matrix form. Each μ-STM 32 has the same arrangement as that described with reference to FIGS. 2A to 2C, and a detailed description thereof will be omitted. Note that the same reference numerals in FIGS. 4A to 4C denote the same parts as in FIGS. 2A to 2C. That is, reference numeral 4 denotes a substrate of a μ-STM; and 6, a micro chip electrode. Each μ-STM 32 is formed in a region of 3 mm × 3 mm (9 m²). Since the wafer 31 has a diameter of 4 inches, 500 μ-STMs can be arranged in an illustrated manner. As described above, the micro chip electrode 6 can be formed in a region of 1 mm² by using an LSI process. In addition, such a large number of μ-STMs 32 can be simultaneously formed. Note that the μ-STMs 32 are preferably arranged at a higher packing density.

Wiring shown in FIGS. 5 and 6 is formed in the 500 μ-STMs. More specifically, as shown in FIG. 5, scanning electrodes 12, 14, and 16 (see FIG. 2B) and the micro chip electrodes 6 for applying bias voltages are connected in parallel in units of rows. The μ-STMs 32 connected in units of rows are further connected in parallel in units of columns as shown in FIG. 6. One μ-STM 32 is formed in each region, although not shown in FIG. 6. Since all the μ-STMs are connected in parallel with each other, all the 500 μ-STMs 32 can be simultaneously scanned in the same direction by using only one driving power source. Therefore, 500 circuit patterns can be simultaneously written on a semiconductor wafer.

A method of forming circuit patterns by a direct writing method using the circuit pattern forming apparatus of the embodiment will be described below. Although a write operation of only μ-STM 32 will be described below, all the 500 μ-STMs operate in the same manner.

As shown in FIG. 7, the μ-STM 32 and a semiconductor wafer 1 are placed in a dimethyl cadmium gas atmosphere, and are fixed at a distance of several nm from each other. When a positive bias voltage of about 12 V is applied to the chip electrode 6 in this state, a tunnel current or a field-emission current (in this case, field-emission electrons) flows. Dimethyl cadmium is then dissociated by the electron beam, and Cd is deposited on the semiconductor wafer 1. Therefore, by driving actuators 5X and 5Y (see FIG. 2), Cd particles can be caused to be deposited in arbitrary points, and an arbitrary pattern can be formed.

Figure 10A:
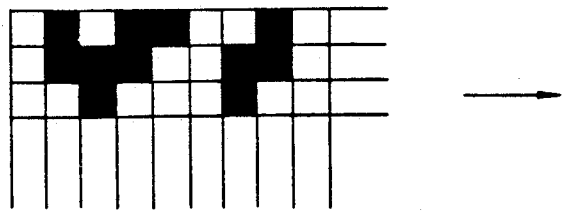
Figure 10B:

FIGS. 8 to 10 show such a pattern forming method in detail. More specifically, if a bias voltage is applied to the chip electrode 6, writing is performed at a corresponding position. If no bias voltage is applied to it, writing is not performed at a corresponding position. Therefore, if the first row is scanned as indicated by an arrow in FIG. 8A, while a bias voltage is applied as shown in FIG. 8B, Cd particles can be caused to be deposited in only the positions where the bias voltage is ON so as to form a dot pattern. When the second and third rows are subsequently scanned as shown in FIGS. 9A to 10B, a Cd pattern shown in FIG. 10A can be written on the wafer 1. Note that one dot has a size of 10 nm × 10 nm. Hence, a micro circuit pattern having a line width of 10 nm can be formed.

Figure 1A:
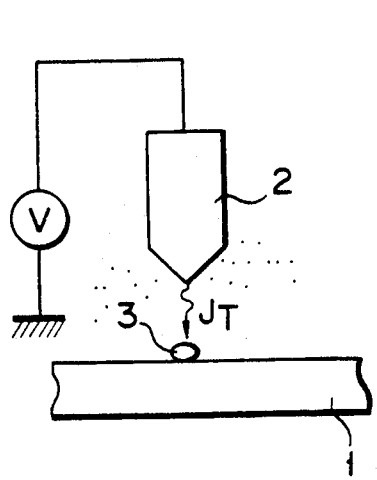
FIGS. 1A and 1B are views for explaining a circuit pattern forming method based on the principle of an STM.
Figure 1B:
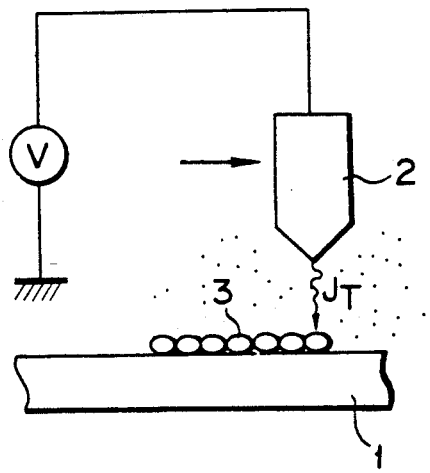
Figure 11A:
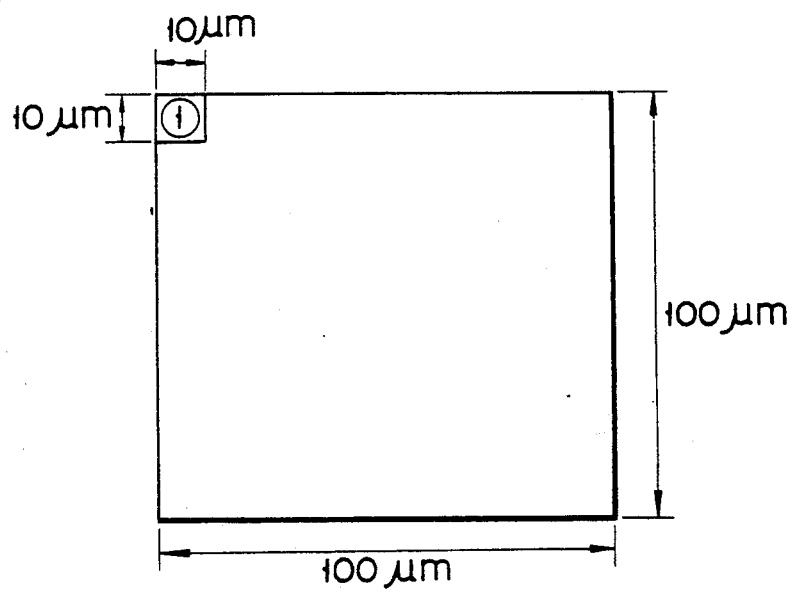
Figure 11B:
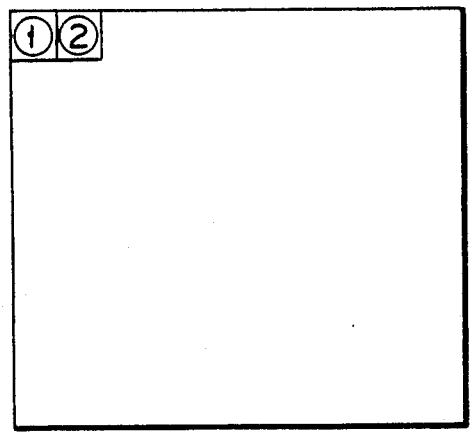

If a micropattern having a line width of 10 nm can be formed, a conventional LSI circuit which is formed on an LSI-chip region of 1 cm × 1 cm by using a pattern forming technique for a line width of 1 μm can be integrated in a region of 100μ × 100μ, as shown in FIG. 11A. However, the scanning range of the μ-STM using the actuators 5X and 5Y is about 10 μm × 10 μm at best. A pattern must be written in a region 100 times larger than the scanning range. For this purpose, the LSI-chip region is divided into 100 areas, and patterns must be respectively formed in the areas and connected to each other by translating the μ-STM in parallel. More specifically, a pattern is formed in the first area as shown in FIG. 11A, and the μ-STM is then translated in parallel to form a pattern in the second area as shown in FIG. 11B. It is apparent that the pattern is formed in the second area so as to be connected to the pattern formed in the first area. In order to accurately connect the patterns which are formed in the respective areas in this manner, the μ-STM must be translated with high precision. For this purpose, the write head shown in FIG. 1 may be fixed on an X-Y stage incorporating a stepping motor.

A circuit pattern forming apparatus according to another embodiment of the present invention will be described below with reference to FIGS. 12 and 13.

Figure 3A:
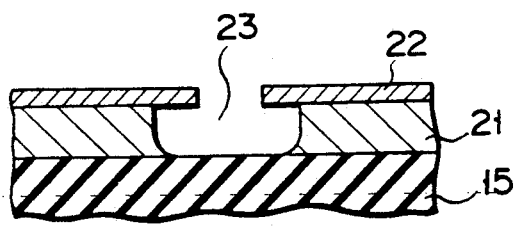
FIGS. 3A to 3C are views showing a known method of forming a micro chip electrode of a μ-STM.
Figure 3B:
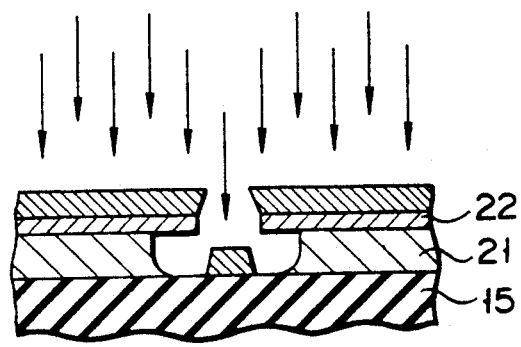
Figure 3C:
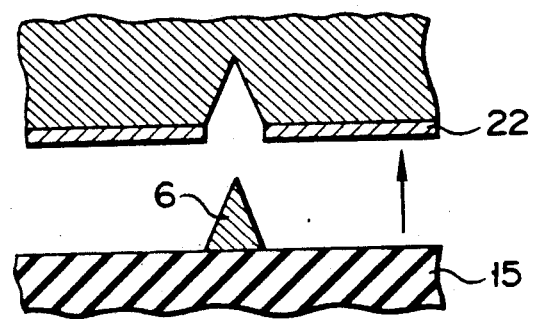
Figure 12A:
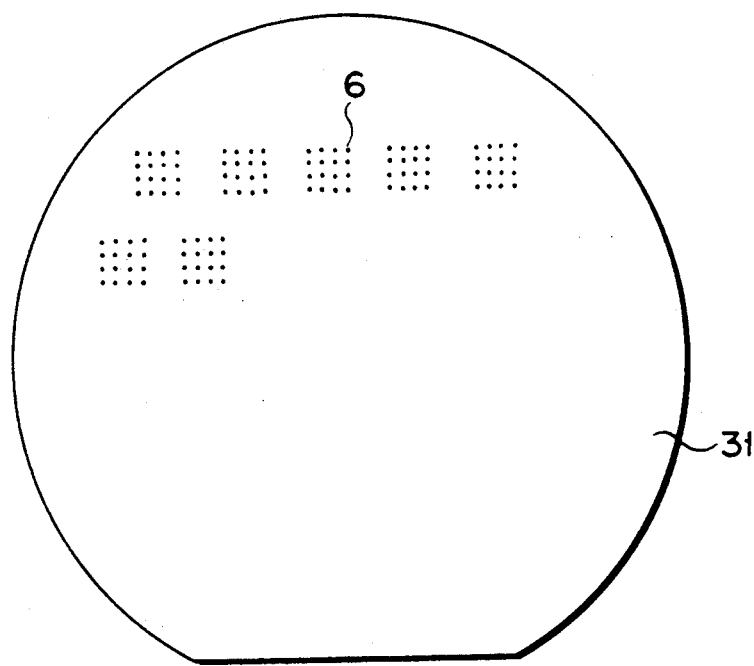
Figure 12B:
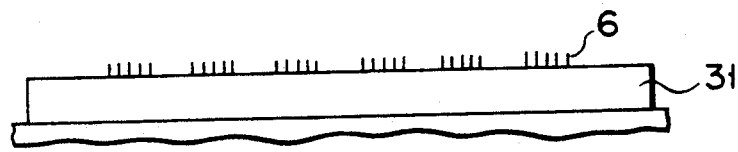
Figure 12C:
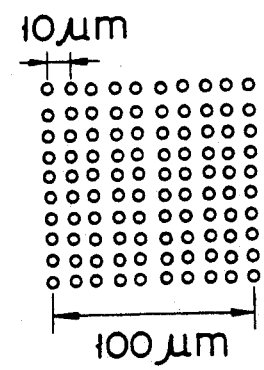

In this embodiment, as shown in FIGS. 12A and 12B, a large number of micro chip electrodes 6 without actuators are arrayed on a surface of a substrate wafer 31. Each micro chip electrode 6 has a diameter of 100 Å or less and a height of about 2 μm. Such micro chip electrodes 6 can be formed by the method described with reference to FIGS. 3A to 3C. A large number of micro chip electrodes 6 are arranged into micro chip electrode units each consisting of 100 chip electrodes 6. The 100 micro chip electrodes 6 in each micro chip electrode unit are arranged to form a 10 × 10 matrix, as shown in FIG. 12C. The distance between the adjacent micro chip electrodes 6 is 10 μm. A bias voltage applying wire is formed for each micro chip electrode 6. Therefore, bias voltages can be independently applied to the respective micro chip electrodes 6.

As shown in FIG. 13A, the substrate wafer 31 on which the large number of micro chip electrodes 6 are formed is fixed on a support member 33. The support member 33 is coupled to a fixed frame 35 through X- and Y-direction actuators 34X and 34Y. FIG. 13B is a sectional view taken along line B—B in FIG. 13A.

As described above, in the write head of this embodiment, actuators are not arranged for each micro chip electrode 6. Therefore, the chip electrodes 6 cannot be independently scanned. However, since the actuators 34X and 34Y are arranged on the substrate wafer 31, all the chip electrodes 6 can be simultaneously scanned in the same direction by moving the substrate wafer 31. In this case, the relative positions of the chip electrodes 6 are not changed.

Another characteristic feature of this embodiment is that the 100 micro chip electrodes 6 are arranged in the form of a $10 \times 10$ matrix at intervals of 10 $\mu$m in each micro chip electrode unit, as shown in FIG. 12C. With this arrangement, a continuous pattern can be formed in an LSI-chip region shown in FIG. 11 without performing a translation operation using an X-Y stage as in the above embodiment.

More specifically, one micro chip electrode unit has the same area as that of the LSI-chip region shown in FIG. 11A, i.e., 100 $\mu$m $\times$ 100 $\mu$m. Consequently, if the scan range of the chip electrode 6 by means of the actuators 34X and 34Y is 10 $\mu$m, any portion of the entire 100 $\mu$m $\times$ 100 $\mu$m LSI-chip region falls within the scan range of a certain micro chip electrode unit. In addition, a bias voltage can be independently applied to the respective micro chip electrodes 6. If, therefore, direct writing is performed in the same manner as described with reference to FIG. 7, Cd particles can be deposited on arbitrary positions in the 100 $\mu$m $\times$ 100 $\mu$m region by using the 100 micro chip electrodes 6 included in one micro chip electrode unit without performing a translation operation using an X-Y stage. That is, the 100 micro chip electrodes 6 simultaneously write different patterns and form a desired pattern in the 100 $\mu$m $\times$ 100 $\mu$m region as a whole.

In the above-described embodiment, the 100 micro chip electrodes 6 constituting one micro chip electrode unit are formed in a 100 $\mu$m $\times$ 100 $\mu$m region. Therefore, 500 micro chip electrodes units can be formed in the 4-inch substrate wafer 31. If the respective chip electrodes 6 are arranged in all the 500 micro chip electrode units in parallel with each other, and the same bias voltage is applied to all the respective chip electrodes 6, circuit patterns of the same number as that of the micro chip electrode units can be formed at once. In this case, 100 power source circuits (one in the preceding embodiment) for applying bias voltages are required, but the time required to write a pattern in an LSI-chip region can be reduced to 1/100.

In order to perform a write operation in an atmosphere of an organometallic gas such as a dimethyl cadmium gas as described above, the operation must be performed in a vacuum chamber. FIG. 14 shows an apparatus used for this operation. Referring to FIG. 14, reference numeral 40 denotes a vacuum chamber. The vacuum chamber 40 includes a mechanism for introducing an organometallic gas, and a mechanism for controlling a gas pressure to be 1 mTorr or less during an operation. An X-Y stage 41 is arranged in the vacuum chamber 40. The X-Y stage 41 can be translated within a small range and be positioned with high precision by an incorporated stepping motor. A support base 42 is arranged on the stage 41. A write head substrate 31 including a large number of micro chips 4 constituting a $\mu$-STM is firmly fixed on the support base 42 so as not to be moved during the movement of the X-Y stage.

A circuit substrate convey mechanism 43 is arranged in the vacuum chamber 40. The mechanism 43 can be vertically moved and pivoted within a horizontal plane in the vacuum chamber 40. The mechanism 43 includes a Z stage 44 incorporating a stepping motor, and stacking type actuators 45a to 45c. A semiconductor wafer 1 on which patterns are to be formed is conveyed from a preliminary chamber into the vacuum chamber 40 by the substrate convey mechanism 43. When the mechanism 43 reaches a predetermined horizontal position where the center of the semiconductor wafer 1 coincides with that of the write head 31, it is lowered to bring the semiconductor wafer 1 to a position 1 mm away from the write head 31. Thereafter, the Z stage 44 arranged on the substrate convey mechanism 43 and the actuators 34a to 45c arranged on the Z stage 44 bring the semiconductor wafer 1 to a position (0.1 $\mu$m distant from the write head 31) where a tunnel current flows between the semiconductor wafer 1 and the write head 31. More specifically, the wafer 1 is brought to a position about 1 $\mu$m away from the write head 31 by the Z stage 44. The wafer 1 is then brought to a position 0.1 $\mu$m away from the write head 31 upon driving of the actuators 45a to 45c. After the wafer 1 is fixed at this position, pattern formation is performed by a direct writing operation using the above-described method.

When writing is to be performed, the semiconductor wafer 1 and the write head 31 must be positioned parallel to each other. If they ar not parallel to each other, a tunnel current does not flow at some portions, and portions on which no circuit pattern can be written or defective portions may appear. This problem can be solved by using the three actuators 45a to 45c in the following manner during positioning of the semiconductor wafer 1.

As shown in FIG. 15A, the actuator 45a is expanded first to cause a portion of the semiconductor wafer 1 to approach the micro chip electrode 6 up to the tunneling region. That the portion reaches the tunneling region can be confirmed by detecting a tunnel current from the chip electrode 6. As shown in FIG. 15B, the actuators 45b and 45c are sequentially expanded to cause the wafer 1 to approach the write head 31 until tunnel currents are detected from all the micro chip electrodes 6. In addition, the position of the semiconductor wafer 1 is adjusted to set variations in these tunnel currents to be 10% or less. This fine adjustment is preferably performed in the evacuated chamber 40. Even in an organometallic gas atmosphere, however, if a bias voltage between the micro chip electrode 6 and the semiconductor wafer 1 is set to be 100 mV or less, the position of the wafer 1 can be finely adjusted in the above-described manner without causing writing.

By using the apparatuses in the respective embodiments, a pattern can be formed not only by the above-described direct writing method but also by lithography.

When lithography is to be employed, writing is performed with respect to a mask material film formed on a surface of a semiconductor wafer 1 in the same manner as in the direct writing method. A mask pattern is then formed upon development. Thereafter, a desired pattern is formed by selective etching using this mask pattern or a lift-off method. A resist film, especially an LB film, is preferably used as a mask material film for this operation.

As has been described in detail above, according to the present invention, by using a write head on which a plurality of micro chip electrodes constituting a μ-STM are arranged, micro wiring patterns and the like can be simultaneously and efficiently formed on a large number of LSI-chip regions on a semiconductor wafer.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. An apparatus for forming a predetermined circuit patterned on a circuit substrate by using a μ-STM write head, said μ-STM write head comprising:
   a write head substrate having a flat surface;
   a plurality of micro chip electrodes formed upright on the flat surface of said write head substrate and constituting a μ-STM, a level of a distal end of each of said micro chip electrodes being set to be constant, such that the distal ends of each of said micro chip electrodes are in a common plane parallel to the write head substrate; and
   scanning means for scanning said micro chip electrodes by moving said micro chip electrodes and the circuit substrate relative to each other in two-dimensional directions;
   said scanning means including:
      a plurality of actuators of the same number as that of said micro chip electrodes, said actuators being separately operable for independently scanning at least in two mutually perpendicular directions in a plane parallel to said common plane, and said actuators being formed on the flat surface of said write head substrate, said micro chip electrodes being respectively supported on said actuators so as to be independently scanned, relative to said circuit substrate, in said two mutually perpendicular directions; and
      an X-Y stage for moving said circuit substrate and said write head substrate relative to each other at least in two mutually perpendicular directions in a plane parallel to said common plane over a wide range exceeding the scanning range of each of the micro chip electrodes driven by the actuators.

2. An apparatus according to claim 1, wherein said actuators comprise only two-dimensional actuators which scan in only two mutually perpendicular directions.

3. An apparatus according to claim 1, wherein said actuators comprise three-dimensional actuators which scan in three mutually perpendicular directions.

4. An apparatus according to claim 1, wherein said XY stage provides stepwise movement of said circuit substrate and said write head substrate relative to each other at least in said two mutually perpendicular directions in said plane parallel to said common plane.

* * * * *